(12) United States Patent
Khan et al.

(10) Patent No.: US 6,878,593 B2
(45) Date of Patent: Apr. 12, 2005

(54) METAL OXIDE SEMICONDUCTOR HETEROSTRUCTURE FIELD EFFECT TRANSISTOR

(75) Inventors: Muhammad Asif Khan, Irmo, SC (US); Remigijus Gaska, Latham, NY (US); Michael Shur, Latham, NY (US); Jinwei Yang, Lexington, SC (US)

(73) Assignee: Sensor Electronic Technology, Inc., Latham, NY (US)

( * ) Notice: Subject to any disclaimer, the term of this patent is extended or adjusted under 35 U.S.C. 154(b) by 0 days.

(21) Appl. No.: 10/647,714

(22) Filed: Aug. 25, 2003

(65) Prior Publication Data

US 2004/0036086 A1 Feb. 26, 2004

Related U.S. Application Data

(62) Division of application No. 09/966,559, filed on Sep. 27, 2001, now Pat. No. 6,690,042.
(60) Provisional application No. 60/235,563, filed on Sep. 27, 2000.

(51) Int. Cl.$^7$ .............................................. H01L 21/336
(52) U.S. Cl. ........................ 438/285; 257/192; 257/194
(58) Field of Search ......................................... 438/285

(56) References Cited

U.S. PATENT DOCUMENTS

| | | | |
|---|---|---|---|
| 5,424,227 A | | 6/1995 | Dietrich et al. |
| 5,929,467 A | * | 7/1999 | Kawai et al. ............... 257/192 |
| 5,990,531 A | | 11/1999 | Taskar et al. |
| 6,246,076 B1 | * | 6/2001 | Lipkin et al. .................. 257/77 |
| 6,298,079 B1 | | 10/2001 | Tanaka et al. |
| 6,316,793 B1 | | 11/2001 | Sheppard et al. |
| 6,479,843 B2 | | 11/2002 | Huang et al. |
| 6,486,502 B1 | * | 11/2002 | Sheppard et al. ........... 257/194 |

OTHER PUBLICATIONS

"DC, Microwave, and hing–Temperature Characteristic of GaN FET Structure," S.C. Binari et al., Inst. Phys. Conf. Ser. No. 141: Chapter 4, Presented at Int. Symp. Compound Semicond., San Diego, CA, Sep., 18–22, 1994, pp. 459–462.*

"Optoelectronic GaN–based Field Effect Transistors," M. S. Shur et al., SPIE, vol. 2397, pp. 294–303, Feb. 7, 1995.

"High Pinch–off Voltage AlGaN–GaN Heterostructure Field Effect Transistor," M. S. Shur et al., Proceedings of ISDRS–97, pp. 377–380, Charlottesville, VA, Dec. 1997.

"DC, Microwave, and High–Temperature Characteristics of GaN FET Structures," S. C. Binari et al., Inst. Phys. Conf. Ser. No. 141: Chapter 4, Presented at Int. Symp. Compound Semicond., San Diego, CA, Sep. 18–22, 1994, pp. 459–462.

"GaN—AlxGa1–xN Heterostructures Deposition by Low Pressure Metalorganic Chemical Vapor Deposition For Metal Insulator Semiconductor Field Effect Transistor (MISFET) Devices," M. Khan et al., Material Research Society Symposium Proceedings vol. 281 (1993), pp. 769–774.

"Low Dark Current Transparent Schottky Barrier UV Detectors," G. Simin et al., ICNS3, Montpellier, Jun. 1999.

(Continued)

Primary Examiner—David Nelms
Assistant Examiner—Thao P. Le
(74) Attorney, Agent, or Firm—John W. LaBatt, Esq.; Hoffman, Warnick & D'Alessandro LLC

(57) ABSTRACT

A method and structure for producing nitride based heterostructure devices having substantially lower reverse leakage currents and performance characteristics comparable to other conventional devices. The method and structure include placing one or more layers of nitride-based compounds over a substrate. Additionally, a dielectric layer including silicon dioxide is placed over the nitride-based layers.

22 Claims, 7 Drawing Sheets-

OTHER PUBLICATIONS

Ren, F. et al., "Effect f temperature on Ga2O3(Gd2O3)/GaN metal–oxide–semiconductor field–effect transistors," Applied Physics Letters, vol. 73, No. 26, Dec. 28, 1998, pp. 3893–3895.

Gaska, R. et al., "Electron in modulation–doped AlGaN–GaN heterostructures," Applied Physics Letters, vol. 74, No. 2, Jan. 11, 1999, pp. 287–289.

Khan, M.A. et al., "Current/voltage characteristic collapse in AlGaN/GaN heterostructure insulated gate field effect transistors at high drain bias," Electronics Letters, vol. 30, No. 25, Dec. 8, 1994, pp. 2175–2176.

Carrano, J.C. et al., "Very low dark current metal–semiconductor–metal ultraviolet photodetectors fabricated on single–crystal GaN epitaxial layers," Applied Physics Letters, vol. 70, No. 15, Apr. 14, 1997, pp. 1992–1994.

Chen, Q. et al., "Schottky barrier detectors on GaN for visible–blind ultraviolet detection," Applied Physics Letters, vol. 70, No. 17, Apr. 28, 1997, pp. 2277–2279.

Khan, M.A. et al., "AlGaN/GaN metal–oxide–semiconductor heterostructure field–effect transistors on SIC substrates," Applied Physics Letters, vol. 77, No. 9, Aug. 28, 2000, pp. 1339–1341.

Shur, M.S. and Khan, M.A., "GaN and AlGaN Devices: Field Effect Transistors and Photodetectors," Gordon and Breach Science Publishers, Series Optoelectronic Properties of Semiconductors and Superlattices, vol. 7 GaN and Related Materials II, pp. 47–92, S. Pearton, Editor (1999).

Shur, M.S. and Khan, M.A., "Wide Band Gap Semiconductors. Good Results and Great Expectations," Paper presented at 23rd Int. Symp. Compound Semiconductors, St. Petersburg, Russia, Sep. 23–27, 1996, pp. 25–31.

Khan, M.A. et al., "AlGaN/GaN Metal Oxide Semiconductor Heterostructure Field Effect Transistor," IEEE Electron Device Letters, vol. 21, No. 2, Feb. 2000, pp. 63–65.

* cited by examiner

METAL OXIDE SEMICONDUCTOR HETEROSTRUCTURE FIELD EFFECT TRANSISTOR

REFERENCE TO PRIOR APPLICATIONS

The current application is a divisional of U.S. patent application Ser. No. 09/966,559, filed on Sep. 27, 2001 now U.S. Pat. No. 6,690,042, which claims the benefit of U.S. provisional application Ser. No. 60/235,563, filed on Sep. 27, 2000.

GOVERNMENT LICENSE RIGHTS

The U.S. Government has a paid-up license in this invention and the right in limited circumstances to require the patent owner to license others on reasonable terms as provided for by the terms of DR9A901000-01 awarded b the U.S. army BMDO/SMDC.

BACKGROUND OF THE INVENTION

1. Field of the Invention

The current invention relates generally to the production of nitride based heterostructure devices. In particular, the present invention generally relates to nitride based heterostructures having a silicon dioxide layer for controlling the reverse leakage of current.

2. Background Art

Gallium-Nitride (GaN) based Metal Semiconductor Metal (MSM) devices for visible-blind ultraviolet detection may have reverse leakage current values of about $1 \times 10^{-5}$ A-cm$^{-2}$ (at −5 V) for interlaced electrode geometry MSM detectors. While GaN based transparent Schottky barrier detectors have a very sharp visible-blind cutoff and responsivity values as high as about 0.18 A/W, these devices have reverse leakage currents of approximately $1 \times 10^{-6}$ A-cm$^{-2}$.

Additionally, AlGaN/GaN Heterostructure Field Effect Transistors (HFETs) may have applications in microwave and optical communication systems. GaN-based Metal Insulator Field Effect Transistors (MISFETs) using i-GaN, i-AlGaN/GaN and $Si_3N_4$ as the gate insulator have been attempted. While these devices were operational, they exhibited a current-voltage characteristic collapse at high drain biases due to a large density of interface states. GaN-based Metal Oxide Semiconductor Field Effect Transistors (MOSFETs) using $Ga_2O_3$ and $Gd_2O_3$ oxides for the gate insulator have also been created. However, these devices exhibited a much smaller transconductance than conventional GaN-based High Electron Mobility Transistors.

Therefore, there exists a need for nitride based semiconductor devices having substantially lower reverse leakage currents and performance characteristics comparable or better than conventional devices in all other respects.

BRIEF SUMMARY OF THE INVENTION

The current invention provides a method and structure for controlling reverse current leakage in semiconductor devices by providing nitride based heterostructures having a silicon dioxide dielectric layer.

In a first aspect of the present invention, a method of producing nitride based heterostructure devices is provided. The method comprises the steps of: providing a substrate; applying a first layer over the substrate wherein the first layer includes nitrogen; and applying a dielectric layer over the first layer wherein the dielectric layer includes silicon dioxide.

In a second aspect of the present invention, a method of producing nitride based heterostructure devices is provided. The method comprises the steps of: providing a substrate; applying a first layer over the substrate wherein the first layer includes gallium and nitrogen; and applying a dielectric layer over the first layer wherein the dielectric layer includes silicon dioxide.

In a third aspect of the present invention, a nitride based heterostructure device is provided. The device comprises: a substrate; a first layer over the substrate wherein the first layer includes nitrogen; and a dielectric layer over the first layer wherein the dielectric layer includes silicon dioxide.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
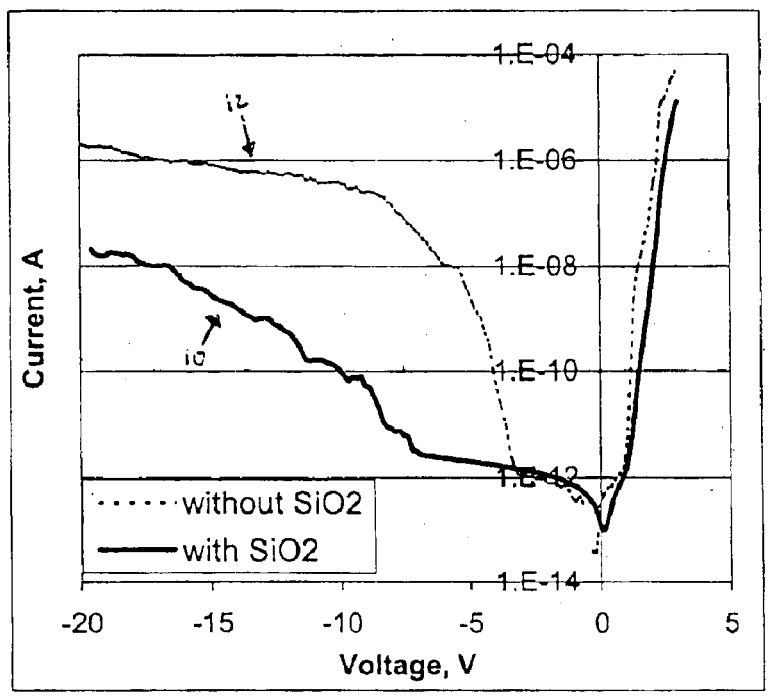
FIG. 1 shows the typical dark I-V characteristics of an approximately 400 $\mu$m diameter Schottky diode.

It is noted that the drawings of the invention are not to scale. The drawings are intended to depict only typical embodiments of the invention, and therefore should not be considered as limiting the scope of the invention. In the drawings, like numbering represents like elements between the drawings.

DETAILED DESCRIPTION OF THE INVENTION

It is understood that for the purposes of the present invention, Al means Aluminum, In means Indium, Ga means Gallium, N means Nitrogen, Si means Silicon, means Oxygen, Ti means Titanium, Ni means Nickel, Pt means Platinum and Au means Gold.

Methods and structures are presented herein that suppress the leakage current found in many GaN-based devices. One way to suppress the leakage current is to use a dielectric layer. The $SiO_2$/GaN heterointerface provides high quality and leads to the passivation of the surface states. The selection of the lateral geometry precludes the need for mesa etching and, hence, significantly reduces the reverse leakage. The leakage current is further reduced by surface passivation of the devices using a Plasma Enhanced Chemical Vapor Deposited (PECVD) $SiO_2$ layer.

In one embodiment of the current invention, a basal plane sapphire substrate was provided. In the next step, an approximately 800 Å thick AlN buffer layer was grown at about 600° C. and 76 Torr over the basal plane sapphire substrate. After this, an epilayer was applied. The epilayer structure for the device consisted of a roughly 1.2 μm thick active layer of n-GaN, which was deposited at about 1000° C. and 76 Torr using a low pressure Metal Organic Chemical Vapor Deposition (MOCVD). The room temperature carrier density for the active n-GaN layer was about $3 \times 10^{16}$ cm$^{-3}$. Finally, a dielectric layer was added over part of the wafer. This layer included a roughly 0.1 μm thick layer of $SiO_2$ which was deposited onto a part of the wafer surface using PECVD while the other part of the wafer remained uncovered.

The device further comprised lateral geometry transparent Schottky barriers surrounded by annular Ohmic contacts. The Schottky barriers were formed both in the $SiO_2$ covered and the non-$SiO_2$ regions. The Ohmic contacts were formed using Ti/Al/Ni/Au and were annealed at about 650° C. for 1 minute in a forming gas. The transparent Schottky barriers were formed with an approximately 50–75 Å thick Pt layer, which was deposited using e-beam metallization and a standard liftoff process. Schottky barriers with diameters ranging from about 50 to 400 mm were fabricated. The Ohmic contact and the transparent Schottky barriers were separated by about a 10 μm gap.

It should be recognized that other nitrogen-based binary compounds including one element from the group-III element group, ternary compounds including two elements from the group-III element group, and quaternary compounds including three elements from the group-III element group are suitable for use in the active layer. The active layer may also comprise multiple layers of the above-described binary, ternary and/or quaternary compounds. The chemical compositions of the layers may be substantially constant, abruptly change or gradually change over distance within layers or from layer to layer. Additionally, while SiC and sapphire are used as the substrates throughout the examples, it should be recognized that the current invention applies equally to the use of other substrates including sapphire, SiC, spinel substrates and silicon.

The product of this and other embodiments of the current invention can be used in many types of semiconductor devices, power switching devices and microwave devices. These devices include, for example, photodetectors, field effect transistors, gated bipolar junction transistors, gated hot electron transistors, gated heterostructure bipolar junction transistors, gas sensors, liquid sensors, pressure sensors and multi function sensors of pressure and temperature.

Turning to FIG. 1, current versus voltage is plotted for the dark I-V characteristics of an approximately 400 μm diameter Schottky diode with $SiO_2$ passivation (solid curve) and without $SiO_2$ passivation (dashed curve). Both devices were fabricated on the same wafer. As seen in FIG. 1, for the voltage range of about −10 to −20 V, the leakage current of the device with $SiO_2$ passivation 10 was about 100–10,000 times less than that of the device without passivation 12.

Figure 2:
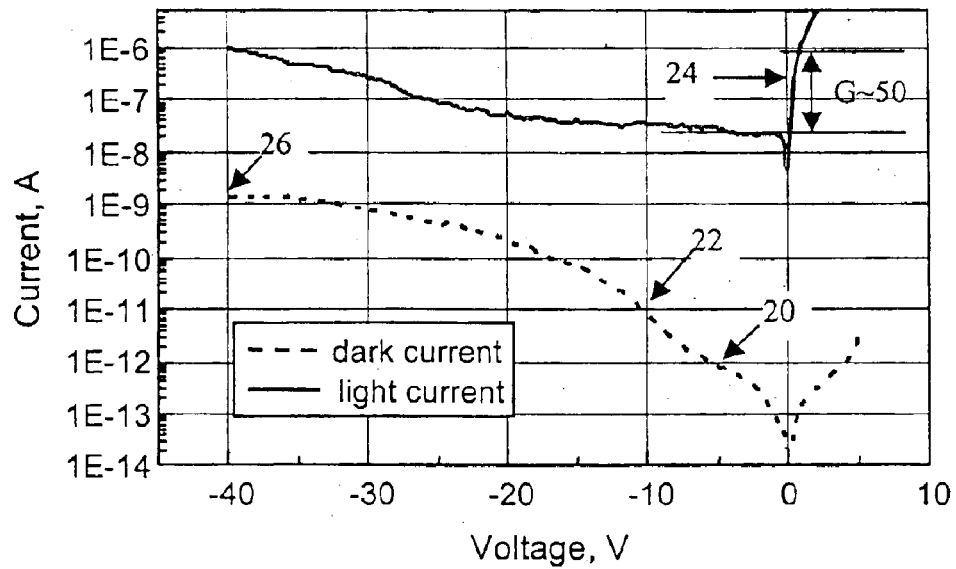
FIG. 2 shows dark and light I-V curves for an approximately 200 $\mu$m diameter lateral Schottky photodiode.

In FIG. 2, current versus voltage is plotted for the dark and light characteristics of an approximately 200 μm diameter $SiO_2$ passivated Schottky diode. As seen, the dark current is about 1 pA at five volts reverse bias 20. This current remained nearly constant up to the reverse bias of ten volts 22. Even at forty volts, the dark reverse leakage current was only about 1.5 nA 26.

Using a calibrated UV-enhanced silicon photodiode, the responsivity for the transparent Schottky detector was measured. A Helium-Cadmium (He—Cd) laser at about 325 nm wavelength was used for these measurements. The responsivity at reverse biases between approximately −5 and −10 V was about 0.19 Amps/Watt (A/W). As expected, the gain at reverse bias condition was nearly 1. However, at small forward biases, below the barrier turn-on voltage (0.7 V) 24, a high gain of approximately fifty was measured.

The low frequency noise for the transparent Schottky detectors was also measured. The major noise contribution was 1/f-noise. At about 10 Hz, the noise spectral density was measured to be roughly $5 \times 10^{-23}$ A$^2$/Hz. This noise level is about two orders of magnitude better than other GaN transparent Schottky devices with a mesa etch. The noise reduction may be attributed to the reduced leakage of the device.

The $SiO_2$ layers employed in the current invention are beneficial in developing GaN-based Field Effect Transistors.

In a second embodiment of the current invention, an AlGaN/GaN MOSHFET with a high-quality $SiO_2$/AlGaN interface on a sapphire substrate is presented. The device has output characteristics similar to an AlGaN/GaN HFET, however, the introduction of $SiO_2$ reduces the gate leakage by approximately six orders of magnitude, which is extremely important for high-power and low noise applications.

Figure 3:
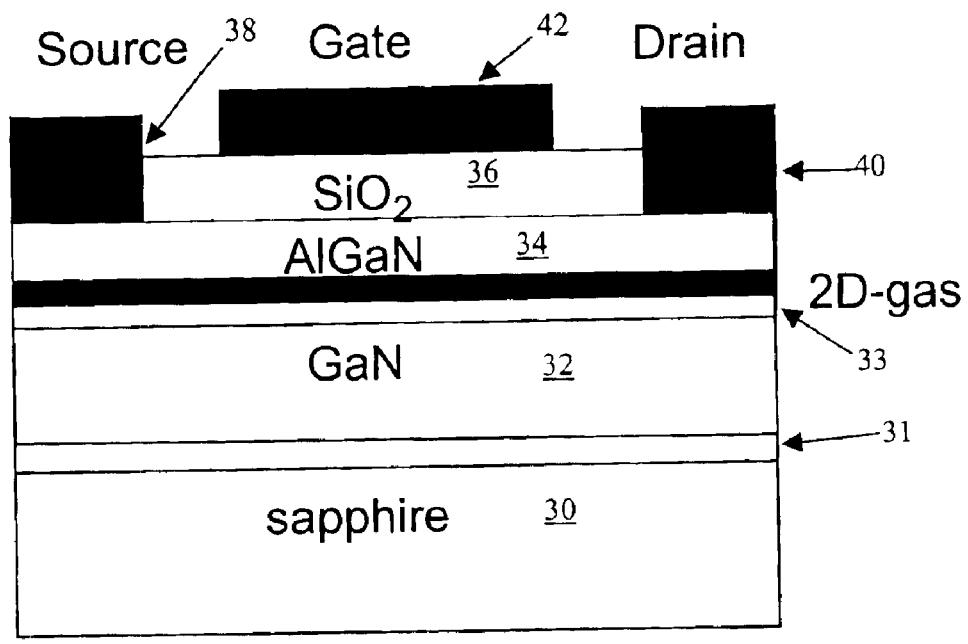
FIG. 3 shows the schematic of an AlGaN/GaN MOSFET structure.

FIG. 3 shows one embodiment of the present device structure. The AlGaN/GaN heterostructure was grown by MOCVD on a sapphire substrate 30. A roughly 50 nm AlN buffer layer 31 was first grown on the substrate 30. The next step was to apply the active layer. This included the deposition of an approximately 1 μm insulating GaN layer 32 and a roughly 50 nm n-GaN layer 33 with an estimated doping level between $2 \times 10^{17}$ cm$^{-3}$ and $5 \times 10^{17}$ cm$^{-3}$. Next, a barrier layer was applied. In this case, the heterostructures were capped with a roughly 30 nm $Al_{0.2}Ga_{0.8}N$ barrier layer 34, which was doped with silicon to approximately $2 \times 10^{18}$ cm$^{-3}$. The measured Hall mobility was about 1,180 cm$^2$/V-s and the sheet carrier concentration was about $1.15 \times 10^{13}$ cm$^{-2}$. Finally, prior to transistor fabrication, a roughly 15 nm $SiO_2$ layer 36 was applied onto the heterostructures using PECVD. The thickness was verified with capacitance-voltage (C-V) measurements on device wafers with and without the $SiO_2$ layer 36.

For fabricating the ohmic contact, the $SiO_2$ layer 36 was removed from the source 38 and drain 40 regions with buffered hydrofluoric (HF) solution. E-beam deposited Ti/Al/Ti/Au (~100 Å/~300 Å/~200 Å/~1000 Å) layers were used for Ohmic drain and source contacts. These contacts were annealed at about 850° C. for about one minute using Rapid Thermal Anneal. The transistors had a source-drain spacing of roughly 5 μm, a gate length of roughly 2 μm, and a gate width of about 150 μm. Helium ion implantation was used to isolate devices. The Transmission Line Model (TLM) measurements yielded a specific contact resistance of about $8.5 \times 10^{-6}$ Ωcm², a contact resistance of about 0.95 Ωmm, and a channel resistance of roughly 2.7 Ωmm. Using Ni/Au (~300 Å/~500 Å) for the gate metal, two sets of devices were then fabricated on the same wafer. These devices consisted of the structures with the gate metal 42 on top of the SiO₂ layer (MOSFET) and with the gate metal directly on the AlGaN barrier layer (not shown, base-line HFET).

Figure 4:
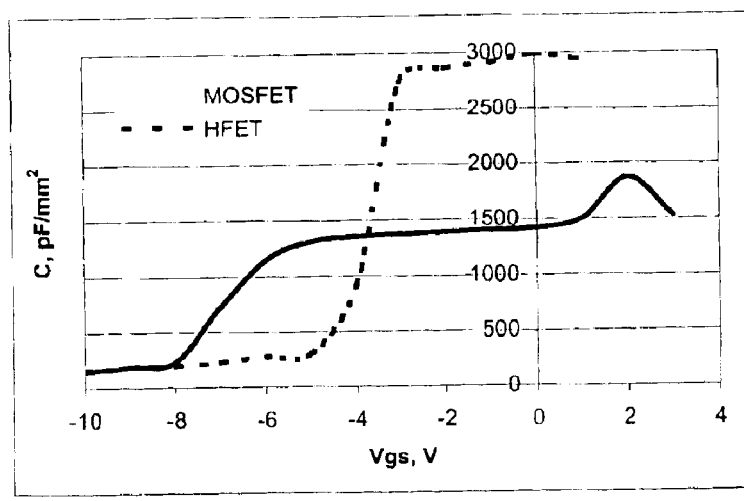
FIG. 4 shows the measured C-V curves of a base-line AlGaN/GaN HFET and of a GaN/AlGaN-based MOSFET.

In FIG. 4, C-V plots for a base-line AlGaN/GaN HFET (dotted line) and a GaN/AlGaN-based MOSFET are shown. From the capacitance ratio of equal area contacts, the SiO₂ layer is estimated to be 13 nm thick. This is close to the value extracted from the PECVD growth rate.

Figure 5A:
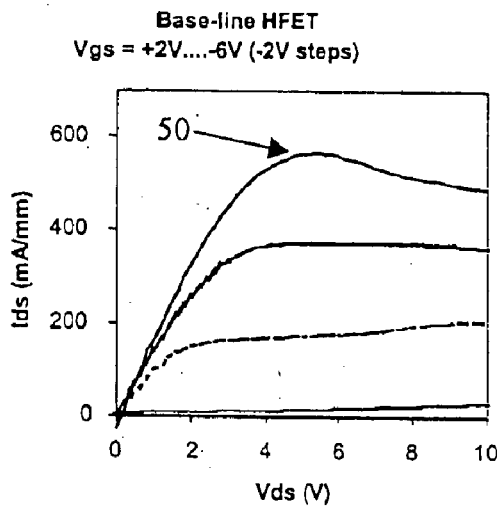
FIG. 5a shows the measured I-V characteristics of a base-line AlGaN/GaN HFET.
Figure 5B:
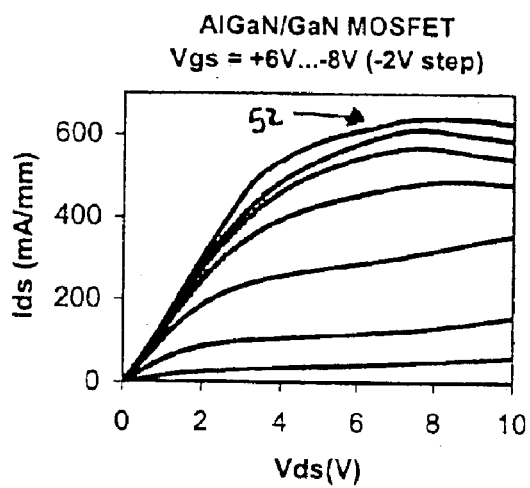
FIG. 5b shows the measured I-V characteristics of a GaN/AlGaN-based MOSFET.

FIG. 5a shows the measured current-voltage (I-V) characteristics of the base-line HFET, while FIG. 5b shows the measured I-V characteristics of the MOSFET fabricated under identical conditions. The device dimensions are exactly the same, except for the distance between the gate and the channel, which is greater for the MOSFET because of the additional approximately 15 nm SiO₂ layer.

As shown in FIG. 5a, the maximum device current for the base-line HFET 50 (about 600 mA/mm) is comparable to the maximum device current for the MOSFET 52, shown in FIG. 5b. The real space transfer into three-dimensional electronic states in GaN at high electron sheet carrier concentrations may limit the peak current in both devices.

From the C-V plots of FIGS. 5a and 5b, the gate capacitance for the MOSFET (~2,900 pF/mm²) and the baseline HFET (~1,400 pF/mm²) were extracted. For a MOSFET gate voltage swing of about 8 V, this corresponds to a sheet electron concentration in the channel, $n_s = C_g V_{gt}/q$, close to $1.4 \times 10^{13}$ cm⁻², and to an effective carrier velocity in the channel, $v_{eff} = I/(q\, n_s)$, of about $0.3 \times 10^5$ m/s, which is quite reasonable. (Here q is the electronic charge and I is the device current per unit gate width.) The estimated value of the sheet electron concentration is in good agreement with the measured values from the Hall mobility data.

Figure 6A:
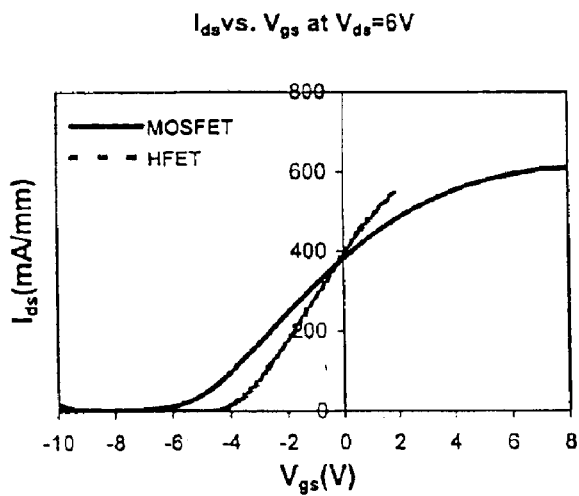
FIG. 6a shows the device saturation current in the saturation region for the MOSFETs and base-line HFETs.

FIG. 6a shows the device saturation current and transconductance in the saturation region for the MOSFET and base-line HFET. As seen in the figure, the maximum saturation current is approximately the same for the two devices.

Figure 6B:
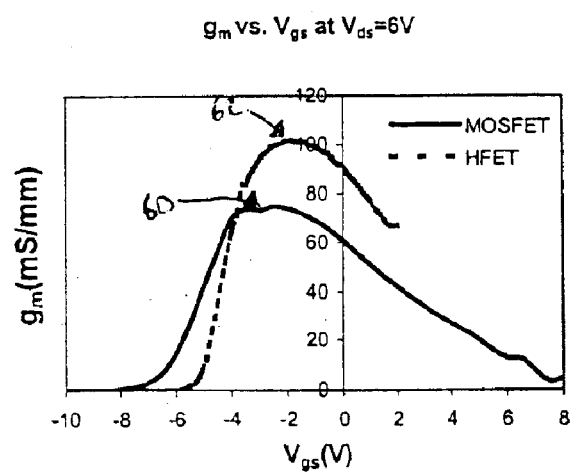
FIG. 6b shows the transconductance in the saturation region for the MOSFETs and base-line HFETs.

FIG. 6b shows the device saturation transconductance in the saturation region for the MOSFET and base-line HFET. The MOSFET saturation transconductance 60 is smaller than that for the base-line HFET 62. This decrease is consistent with the larger separation between the MOSFET channel and the gate contact and with the smaller gate capacitance caused by the low dielectric constant of SiO₂.

The increased gate-to-channel separation is also responsible for a more negative MOSFET threshold voltage. The maximum transconductance 60, $g_m$=75 mS/mm, was measured for a roughly 2 μm long gate device. However, as can be seen from FIG. 6b, the MOSFET has an advantage of having a larger gate voltage swing and a higher linearity than the base-line HFET. This should lead to smaller intermodulation distortion, a smaller phase noise and a larger dynamic range compared to the HFET.

Figure 7:
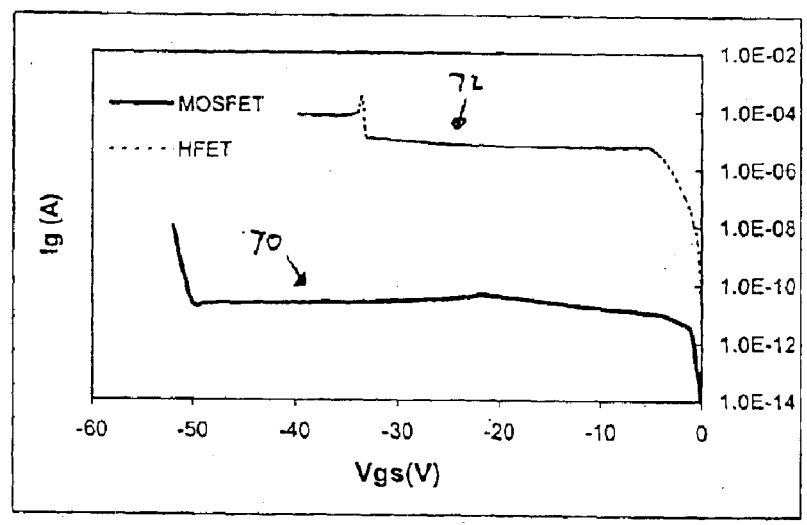
FIG. 7 shows the gate leakage current for a MOSFET and a base-line HFET with identical device geometries.

In FIG. 7, the gate leakage current is shown as a function of voltage. The gate leakage currents for the MOSFET 70 and the base-line HFET 72 with identical device geometries are presented. The data demonstrate that the MOSFET leakage current is several orders of magnitude smaller than that for the base-line HFET. This is advantageous for using the MOSFET as a microwave device.

Figure 8:
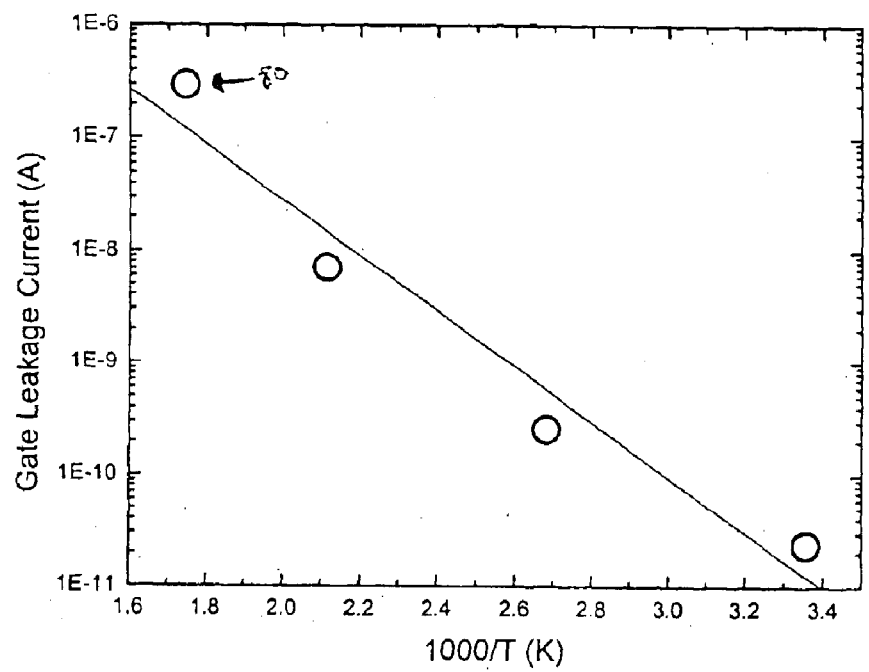
FIG. 8 shows the MOSFET gate current versus temperature.

FIG. 8 shows the MOSFET gate leakage current as a function of temperature. The data shows that the MOSFET gate leakage current remains very low even at elevated temperatures up to about 600 degrees Kelvin 80. The activation energy depends on bias, and can be deduced from the slope of the dependence shown in FIG. 8 in a conventional way. As can be seen, the leakage current is thermally activated with the activation energy at about 35 V on the order of 0.6 eV. This is consistent with the gate leakage current for thermionic-field emission mechanisms at large negative gate biases.

MOSHFETs may be beneficial for various high-power applications. These applications, however, place severe constraints on device thermal management, which can be hardly satisfied with low thermal conductivity sapphire substrates. Hence, AlGaN/GaN MOSHFETs were also developed over insulating 4H—SiC substrates. Device I-V curves demonstrate the channel current as high as about 1.3 A/mm without any evidence of current clamp or negative slope. The microwave and high temperature performance of these MOSHFETs are quite comparable to the base-line HFETs.

The device epilayer structure was grown by low-pressure MOCVD on insulating 4H—SiC substrates. All AlGaN/GaN layers for this structure were deposited at roughly 1000° C. and 76 Torr. An approximately 50 nm AlN buffer layer was first grown at a temperature of about 1000° C., followed by the deposition of an approximately 0.4 μm insulating GaN layer and a roughly 50 nm n-GaN layer with an estimated doping level between about $2 \times 10^{17}$ cm⁻³ and $5 \times 10^{17}$ cm⁻³. The heterostructures were capped with a roughly 30 nm Al₀.₂Ga₀.₈N barrier layer, which was doped with silicon to approximately $2 \times 10^{18}$ cm⁻³. An extremely low-level flux of trimethylindium (TMI) was also present during the growth of all the layers of the structure. The presence of the indium surfactant may assist in improving the surface and interface roughness through the incorporation of trace amounts of indium. The measured room temperature Hall mobility was about 1,150 cm²/V-s and the sheet carrier concentration was roughly $1.2 \times 10^{13}$ cm⁻².

Prior to transistor fabrication, an approximately 10 nm SiO₂ layer was deposited on part of the heterostructure using PECVD. The thickness of this layer, $d_{ox}$, was extracted from the capacitance-voltage (C-V) measurement at about 1 MHz on areas with and without the SiO₂ layer. From the zero volt capacitance of these metal-semiconductor structures (without SiO₂ layer), and using AlGaN layer permittivity $\epsilon_B$=8.8, the AlGaN barrier thickness, $d_B$, is estimated to be 31 nm. This is close to the 30 nm value estimated from the deposition rate. The oxide thickness, $d_{ox}$, was determined using the following equation:

$$C_{MOS} = C_{MS} * \left( \frac{1}{1 + \frac{d_{OX}}{d_B} \cdot \frac{\varepsilon_B}{\varepsilon_{OX}}} \right)$$

Here $C_{MOS}$ and $C_{MS}$ are the capacitances of equal area pads on the oxide and non-oxide areas and $\epsilon_{ox}$=3.9 is the SiO₂ dielectric permittivity. Using the data of the above equation, the SiO₂ thickness, $d_{ox}$, was estimated to be 7 nm. This is in reasonable agreement with the $d_{ox}$ value of 10 nm expected from the deposition rate.

The C-V characteristics were also measured under a strong white light illumination. For the HFET structure (without the SiO₂ layer), the C-V curves in light and dark practically coincide. However, for the MOSHFET structure a threshold voltage shift ΔV~1 V is measured. This voltage shift is likely to be attributed to the charge $\Delta Q=C\Delta V$ induced near the $SiO_2$/AlGaN interface.

Using the MOSHFET device capacitance measured at $V\approx-9$ V, the surface charge density in $SiO_2$ layer, $n_s$, is estimated to be about $1\times10^{12}$ cm$^{-2}$. This is one order of magnitude less than the sheet carrier density (of free carriers) in the 2D electron gas channel of the MOSHFET, thereby indicating a high quality for the $SiO_2$/AlGaN interface.

The use of $SiO_2$/AlGaInN or $SiO_2$/AlGaN structures allows for the development of a large periphery MG MOSHFET device using a unique oxide-bridging approach for source interconnections. This MG MOSHFET (fabricated on a SiC substrate) demonstrates a nearly linear dependence of saturation current, transconductance, microwave gain and saturation power on total device width in a range from about 0.15 to 4 mm. Saturation current, up to roughly 5.1 A was measured for a MOSHFET device with an approximately 6 mm wide gate.

Figure 9:
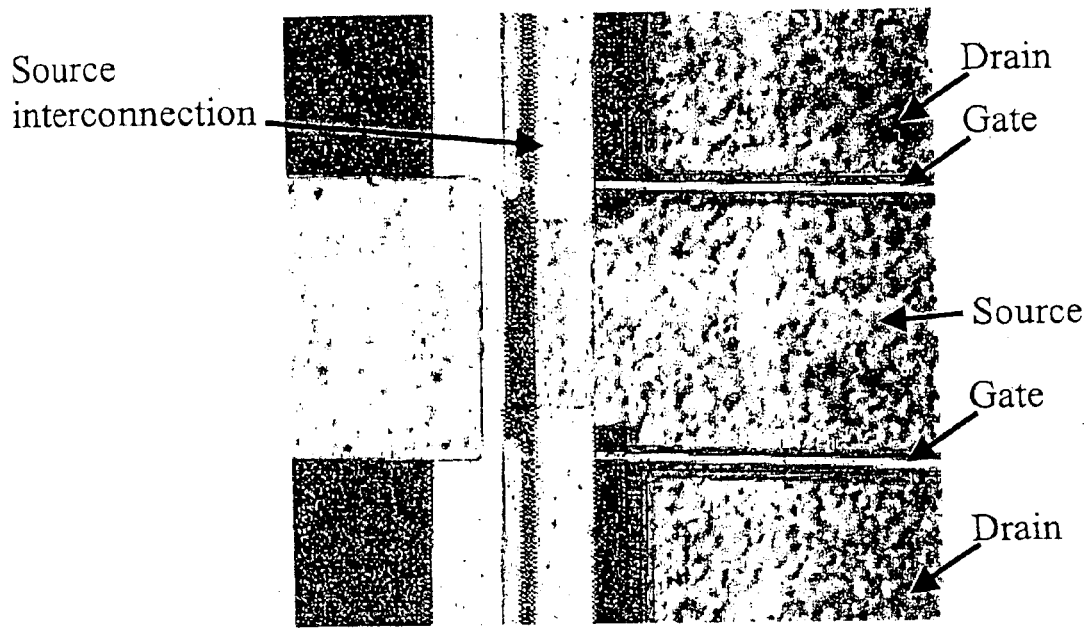
FIG. 9 is a Second Electron emission Microscopy (SEM) image depicting the multi gate (MG) Metal-Oxide-Semiconductor Heterostructure Field Effect Transistor (MOSHFET) design.

FIG. 9 shows an SEM image that displays the MG MOSHFET design. Multi gate device geometry consists of an interlaced source-gate-drain electrode structure. The source-to-source connections go over the gate electrodes with an oxide layer in between for isolation. First, Ohmic contacts for source and drain were fabricated using Ti (~200 Å)/Al(~500 Å)/Ti(~200 Å)/Au(~1500 Å). These were annealed at around 850° C. for about 1 minute in nitrogen ambient. Prior to the gate fabrication, an approximately 10 nm $SiO_2$ layer was deposited on part of the heterostructure using plasma enhanced chemical vapor deposition (PECVD). Ni(~200 Å)/Au(~1000 Å) gate electrodes were then deposited in between the source-drain electrodes with and without $SiO_2$. A single gate electrode had a length of about 1.5 mm and width of roughly 250 $\mu$m. Prior to contact pad formation, PECVD was again used to deposit approximately 0.3 $\mu$m thick $SiO_2$ isolation "islands" at the gate—source intersections. Ti(~200 Å)/Au(~6000 Å) metal electrodes were then deposited to form low resistance section interconnections and device contact pads. The $SiO_2$ bridges (isolation pads) are estimated to increase the total device capacitance by less than 6% for this device symmetry. $BCl_3$ etched mesas were used for device-to-device isolation.

The current-voltage characteristics of a single section for the MOSHFET (~250 $\mu$m gate width) show the saturation current to be about 0.6 A/mm at zero gate bias. It increases to roughly 0.86 A/mm at a positive gate bias $V_g$=+3 V. The pinch-off voltage was about 9 V for MOSHFETs and about 5 V for the HFET devices fabricated on the same wafer. This difference is due to a larger gate-to-channel separation in the MOSHFET.

Figure 10:
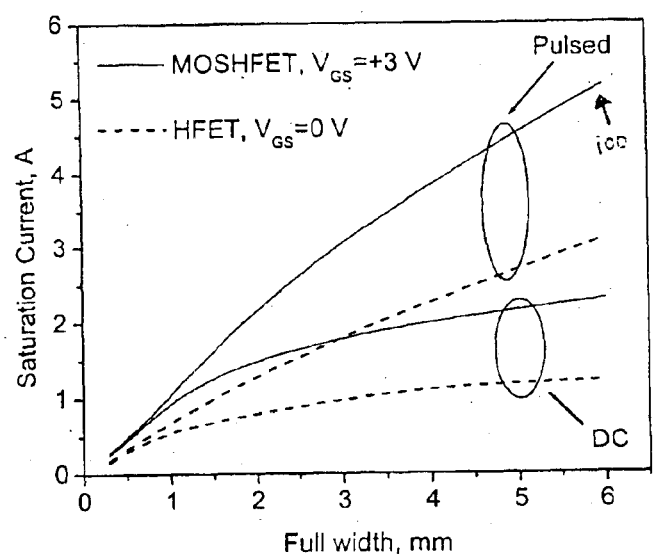
FIG. 10 shows the current (pulsed and DC) versus total gate width measurements for MOSHFETs and base-line HFETs.

FIG. 10 shows the saturation current as a function of total gate width. For both the HFET and MOSHFET devices, DC and pulsed saturation currents are shown. For these I-V measurements, the gate voltage was kept at about +3 V for MOSHFET and 0 V for the HFET (on the same wafer). As seen in the figure, the DC peak current for both device types saturates as the device periphery increases. However, pulsed I-Vs show nearly linear scaling. In pulsed I-V measurements, a saturation current as high as roughly 5.1 A was achieved for an approximately 6 mm wide MOSHFET device 100.

Figure 11:
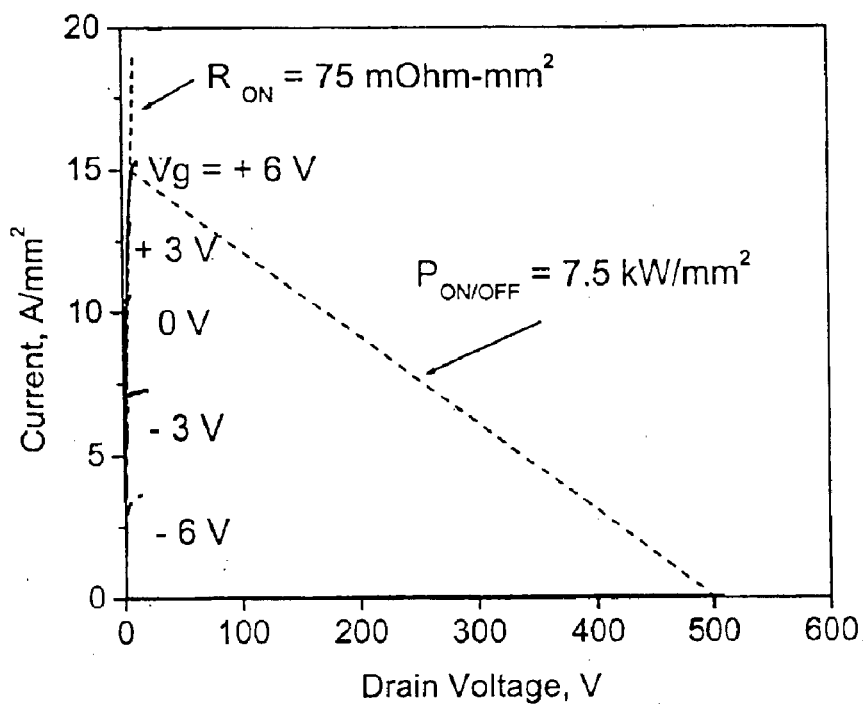
FIG. 11 shows the I-V characteristics of an MG MOSHFET switch.

A similar design (but with a large drain-to-gate spacing) can be used for a power switching device. FIG. 11 shows current as a function of voltage for such an MG MOSHFET switch. The maximum peak current value was more than 15 A/mm$^2$ while the gate leakage current was less than 1 nA/mm.

Figure 12:
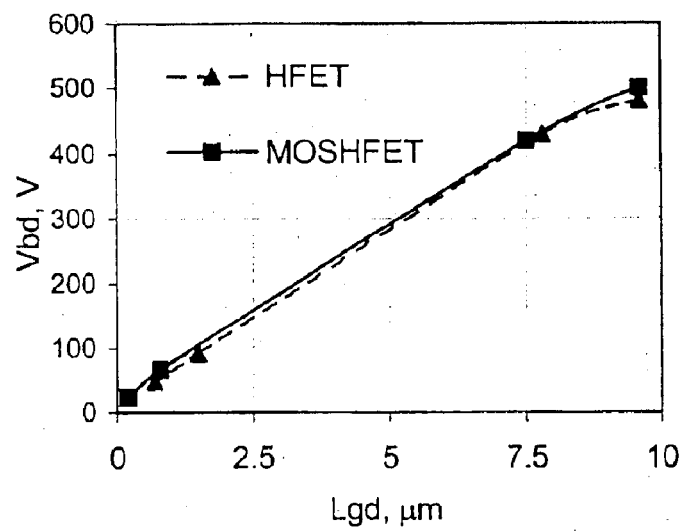
FIG. 12 shows the breakdown voltage for both MOSHFETs and base-line HFETs as a function of gate-to-drain separation.

FIG. 12 shows the MOSHFET breakdown voltage as a function of the gate-to-drain separation. For comparison, the figure also shows the breakdown voltage for an identical geometry HFET fabricated on the same wafer. Both devices show almost linear dependence of breakdown voltage on gate-to-drain distance reaching about 500 V at roughly 10 $\mu$m spacing. Thus, the maximum switching power of the device is about 7.5 kW/mm$^2$. Note that for these estimations, the total device area was used including the roughly 100 $\mu$m separation between adjacent gate sections. Using only the active source-drain region area, the switched power density estimate increases to about 50 kW/mm$^2$.

The specific on-state resistance of the drift region of the MOSHFET switch is less than about 75 mOhm-mm$^2$, which is 2–3 times less than that reported for buried channel SiC FETs and 25–100 times less than that for induced channel SiC MOSFET switches.

Although the GaN-AlGaN MOSHFET is a normally-on device, its input current is extremely small. Even at an elevated temperature of about 250° C., the MOSHFET gate leakage current was measured to be roughly 0.5 nA. Furthermore, a MOSHFET can be converted into a normally-off device by adjusting the thickness of the AlGaN barrier layer and the residual doping in the GaN channel. This performance can also be compared with the switching SiC diode characteristics. This comparison shows that the three-terminal MOSHFET switch performs as well as the best SiC diodes.

The pulse response for a single approximately 250 micron section of the MG MOSHFET switch was measured. The voltage pulse was measured across a roughly 10 Ohm load resistor connected in series with the drain. The DC drain bias and gate-offset voltages were kept at about 15 V and −10 V respectively. The current in the "off state" of the switch was less than about 10 $\mu$A/mm$^2$. The "on state" current at about +3 V gate bias reaches approximately 11.2 A/mm$^2$ which is quite close to the steady state value at the same bias, showing no current collapse in the pulsed operation. The current pulse rise time of about 5 ns was limited by the input pulse rise time from the pulse generator.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method of producing nitride based heterostructure devices comprising the steps of:
   providing a substrate;
   applying a first layer over the substrate wherein the first layer includes nitrogen;
   applying a dielectric layer over the first layer wherein the dielectric layer includes silicon dioxide; and
   applying a first contact above and adjoining to the dielectric layer.

2. The method of claim 1, wherein the substrate includes one of the group comprising sapphire, silicon carbide, a spinel substrate and silicon.

3. The method of claim 1, wherein the first layer further includes a binary compound including one element of the group comprising group III elements.

4. The method of claim 1, wherein the first layer further includes a ternary compound including two elements of the group comprising group III elements.

5. The method of claim 1, wherein the first layer further includes a quaternary compound including three elements of the group comprising group III elements.

6. The method of claim 1, further comprising applying a second layer between the first layer and the dielectric layer wherein the second layer includes nitrogen.

7. The method of claim 6, wherein the first layer further includes a binary compound including one element of the group comprising group III elements and the second layer further includes a ternary compound including two elements of the group comprising group III elements.

8. The method of claim 6, wherein the first layer further includes a ternary compound including two elements of the group comprising group III elements and the second layer further includes a quaternary compound including three elements of the group comprising group III elements.

9. The method claim 1, further comprising:
applying a source contact and a drain contact to the first layer; and
wherein the first contact comprises a gate contact.

10. A method of producing nitride based heterostructure devices comprising the steps of:
providing a substrate;
applying a first layer over the substrate wherein the first layer includes gallium and nitrogen;
applying a dielectric layer over the first layer wherein the dielectric layer includes silicon dioxide; and
applying a contact on the dielectric layer.

11. The method of claim 10, wherein the substrate includes one of the group comprising of sapphire, silicon carbide, a spinel substrate and silicon.

12. The method of claim 10, further comprising applying a second layer between the first layer and the dielectric layer wherein the second layer includes aluminum, gallium and nitrogen.

13. The method of claim 12, wherein the substrate includes one of the group comprising sapphire, silicon carbide, a spinel substrate and silicon.

14. The method of claim 12, wherein the first layer further includes aluminum and the second layer further includes indium.

15. The method of claim 9, wherein the dielectric layer further contacts the source contact and the drain contact.

16. A method of producing a nitride based heterostructure transistor, the method comprising:
providing a substrate;
applying a buffer layer on the substrate, wherein the buffer layer includes aluminum and nitrogen;
applying an active layer on the buffer layer, wherein the active layer includes gallium and nitrogen;
applying a barrier layer on the active layer, wherein the barrier layer includes aluminum and nitrogen;
applying a dielectric layer on the barrier layer, wherein the dielectric layer includes silicon dioxide; and
applying a first contact on the dielectric layer.

17. The method of claim 16, wherein at least a portion of the barrier layer remains uncovered by the dielectric layer.

18. The method of claim 17, further comprising:
applying a source contact on the barrier layer;
applying a drain contact on the barrier layer; and
wherein the first contact on the dielectric layer comprises a gate contact.

19. The method of claim 18, wherein the dielectric layer further contacts the source contact and the drain contact.

20. The method of claim 16, wherein the active layer comprises an insulating layer and an n-type layer on the insulating layer.

21. The method of claim 6, wherein the second layer adjoins the first layer and the dielectric layer.

22. The method of claim 12, wherein the second layer adjoins the first layer and the dielectric layer.

* * * * *

UNITED STATES PATENT AND TRADEMARK OFFICE
CERTIFICATE OF CORRECTION

PATENT NO.    : 6,878,593 B2
DATED         : April 12, 2005
INVENTOR(S)   : Khan et al.

It is certified that error appears in the above-identified patent and that said Letters Patent is hereby corrected as shown below:

<u>Column 3,</u>
Line 1, please insert -- O -- before the word "means"

<u>Column 8,</u>
Line 57, insert -- disposed -- before the word "above"

Signed and Sealed this

Fourteenth Day of June, 2005

JON W. DUDAS
*Director of the United States Patent and Trademark Office*